(12) United States Patent
Fu et al.

(10) Patent No.: US 7,811,723 B2
(45) Date of Patent: Oct. 12, 2010

(54) PHASE-SHIFT MASK AND METHOD FOR FORMING A PATTERN

(75) Inventors: Kuo-Kuei Fu, Taoyuan County (TW); Yuan-Hsun Wu, Chung-Li (TW); Ya-Chih Wang, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 274 days.

(21) Appl. No.: 12/128,617

(22) Filed: May 29, 2008

(65) Prior Publication Data

US 2009/0155699 A1 Jun. 18, 2009

(30) Foreign Application Priority Data

Dec. 17, 2007 (TW) .............................. 96148248 A

(51) Int. Cl.
*G03F 1/00* (2006.01)

(52) U.S. Cl. ......................................................... 430/5
(58) Field of Classification Search ..................... 430/5, 430/322, 323, 394
See application file for complete search history.

(56) References Cited

U.S. PATENT DOCUMENTS 6,165,692 A * 12/2000 Kanai et al. ................. 430/311
2006/0099518 A1 * 5/2006 Tan et al. ....................... 430/5

* cited by examiner

*Primary Examiner*—Stephen Rosasco
(74) *Attorney, Agent, or Firm*—Winston Hsu; Scott Margo; Min-Lee Teng

(57) ABSTRACT

A phase-shift mask for forming a pattern includes a glass substrate and a pattern, a first phase-shift region, a second phase-shift region and a third phase-shift region on the glass substrate. The first phase-shift region and the second phase-shift region are alternately arranged and the third phase-shift regions are formed at the terminal ends of the first phase-shift region.

8 Claims, 9 Drawing Sheets

PHASE-SHIFT MASK AND METHOD FOR FORMING A PATTERN

BACKGROUND OF THE INVENTION

1. Field of the Invention

The present invention relates to a phase-shift mask and a method of using the phase-shift mask to form a pattern. More particularly, the present invention relates to a method for forming a pattern that is capable of solving phase conflict.

2. Description of the Prior Art

Lithography processing remains an essential step in semiconductor manufacturing today. In the integrated circuit making processes, lithography plays an important role in limiting feature size. By using lithography, a circuit pattern can be precisely transferred onto a die or wafer. Typically, to implement the lithography, a designed pattern such as a circuit layout pattern or a contact layout pattern in accordance with a predetermined design rule is created on one or several mask in advance. The pattern on the mask is then transferred onto the wafer with a stepper and scanner. In general, a photosensitive material, such as photoresist, is coated over a top surface of a die or wafer to selectively allow for the formation of the desired geometries, features, lines, or shapes.

As the feature size gets smaller, it becomes critical to improve the resolution of the photolithographic process in semiconductor manufacturing. One approach to improving the resolution is using short-wavelength light, as, theoretically, the shorter the wavelength the higher the possible resolution of the pattern. This method, though simple, is not feasible. Light sources for providing light of short wavelengths are not accessible. Besides, damage to equipment is considerable when short-wavelength light is used in an exposure process, thereby leading to a shortened equipment lifetime. The cost is thus raised, which makes products not competitive. Due to these conflicts between theory and practice, manufacturers are researching ways of overcoming these problems.

In current Resolution Enhancement Technology (RET), phase shift masks are one of the most critical tools for enhancing resolution. Generally speaking, because the phase of light is not shifted when light passes through traditional masks, some light will form constructive interference on the surface of the wafer, resulting in exposed silent patterns that are not supposed to be formed on the wafer under exposure, thereby leading to a worse resolution of pattern.

As known in the art, phase shift masks are masks with additional phase shifters selectively positioned between the metal Cr line patterns. When the light passes through the phase shifter of the phase shift masks, the phase of the electric field of the light is shifted exactly 180°, so the phase difference between the incident light and the shifted light is exactly half a wavelength and destructive interference therefore occurs on the wafer. The interference effect of the diffraction is resolved by the destructive interference and the resolution of the border of the metal lines is thereby enhanced.

The RET of the phase shift masks still has some disadvantages, however. For example, the distance between the line patterns on the phase shift masks is shortened due to reduced feature sizes. This occasionally leads to phase conflict problems. FIG. 1 illustrates an exemplary layout of conventional line patterns on a Cr-less phase shift mask. The phase shift mask 10 includes a glass substrate 11 and patterns 12. The patterns 12 are formed by the alternate arrangement of the first phase-shift regions 13 and the second phase-shift regions 14. When a pitch between the patterns 12 on the phase shift mask 10 is too short due to critical dimension (CD) shrinkage (35 nm for example), a disadvantageous interconnect 16 occurs on the terminal section of the first phase-shift regions 13 and the second phase-shift regions 14 at the border 15 near the phase inversion due to the phase conflict, as shown in FIG. 2. The interconnect 16 causes the line patterns, which should be independent of one another, to connect with each other, forming so-called annular defects and therefore compromising the correctness and the independence of the following patterns.

It is therefore necessary to provide a novel technology for phase-shift masks to solve this problem.

SUMMARY OF THE INVENTION

The present invention relates to a phase-shift mask and a method of using the phase-shift mask to form a pattern. Interconnect is absent in patterns which are formed by this phase-shift mask.

The present invention first provides a phase-shift mask, including a substrate and a third phase-shift region. The substrate has a pattern, a first phase-shift region and a second phase-shift region. The pattern is disposed at the area where the first phase-shift region is adjacent to the second phase-shift region. A first phase difference exists between the first phase-shift region and the second phase-shift region. The second phase-shift region has at least a terminal end. The third phase-shift region is disposed on the substrate and formed at the terminal ends of the second phase-shift region. A second phase difference exists between the third phase-shift region and the first phase-shift region.

The method for forming a pattern of the present invention includes:

providing a first phase-shift mask including a glass substrate and a pattern on the glass substrate, the pattern including a first phase-shift region, a second phase-shift region and a third phase-shift region, the first phase-shift region and the second phase-shift regions being alternately arranged so that the third phase-shift regions are formed at terminal ends of the first phase-shift region; and performing an exposure step to transfer the pattern on the phase-shift mask to a substrate.

Because the first phase region additionally includes a third phase-shift region to cancel the adverse effect of the interference on the border near the phase inversion, even if the pitch of the patterns on the phase-shift mask shortens, the phase conflict on the border of the phase inversion and the undesired interconnect can be avoided. The resolution and the quality of the lithographic patterns formed by the masks are ensured and the problems of the prior art are easily solved.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel phase shift mask, which avoids the defects of the lithographic patterns due to phase shift conflict, to ensure the resolution and the quality of the lithographic patterns and solves the problems of the prior art.

Figure 1:
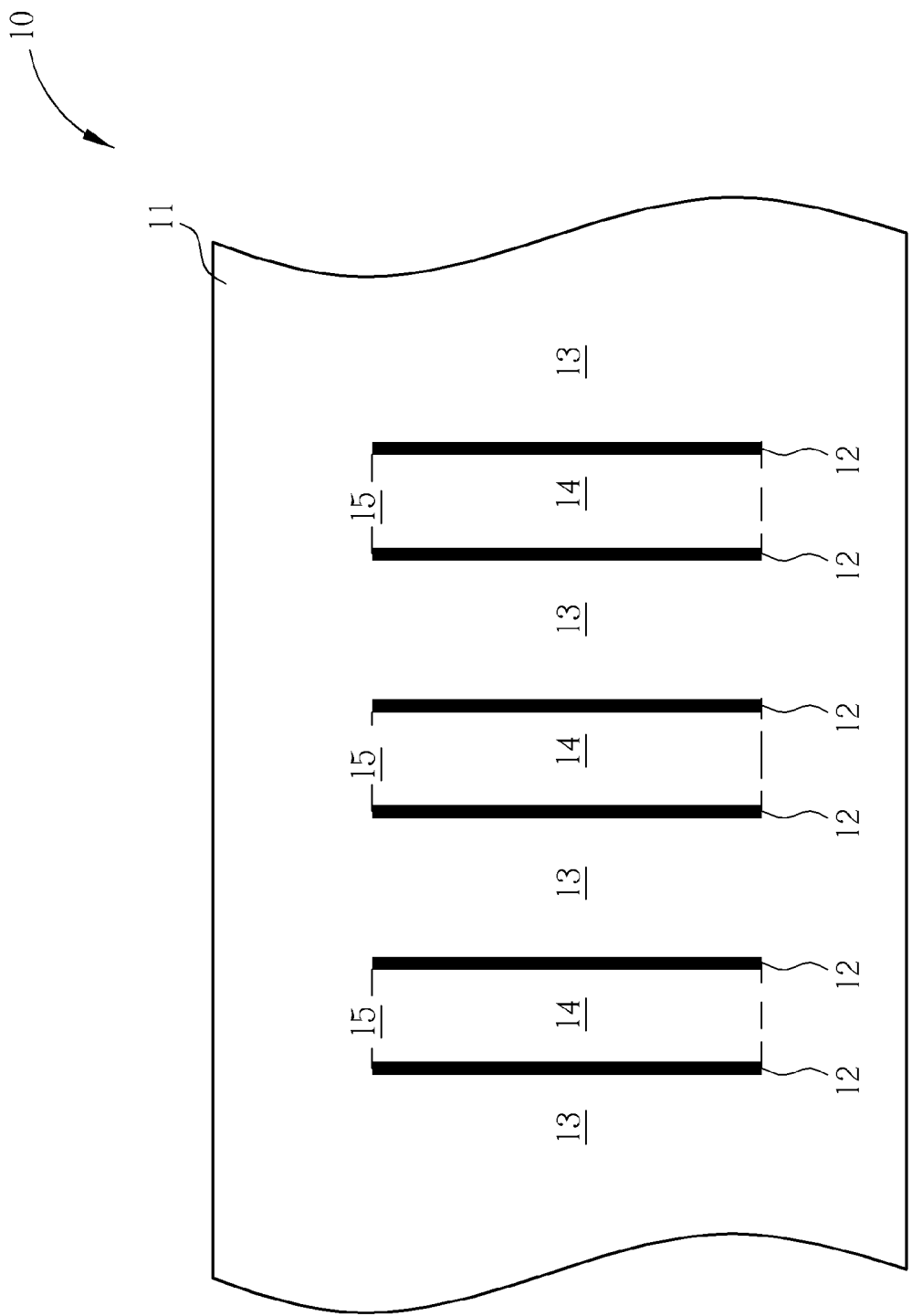
FIG. 1 illustrates the design of line patterns on a conventional phase shift mask.
Figure 2:
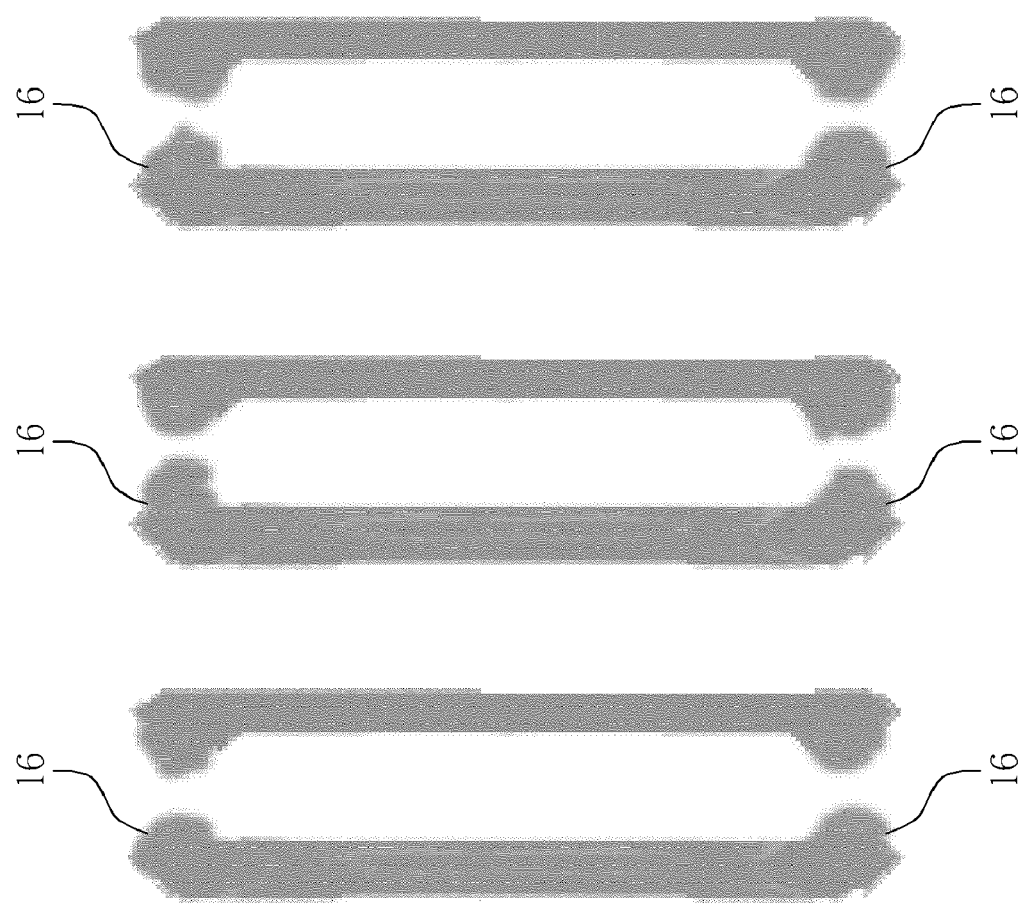
FIG. 2 illustrates a flawed pattern formed by using the conventional phase shift mask in FIG. 1.
Figure 3:
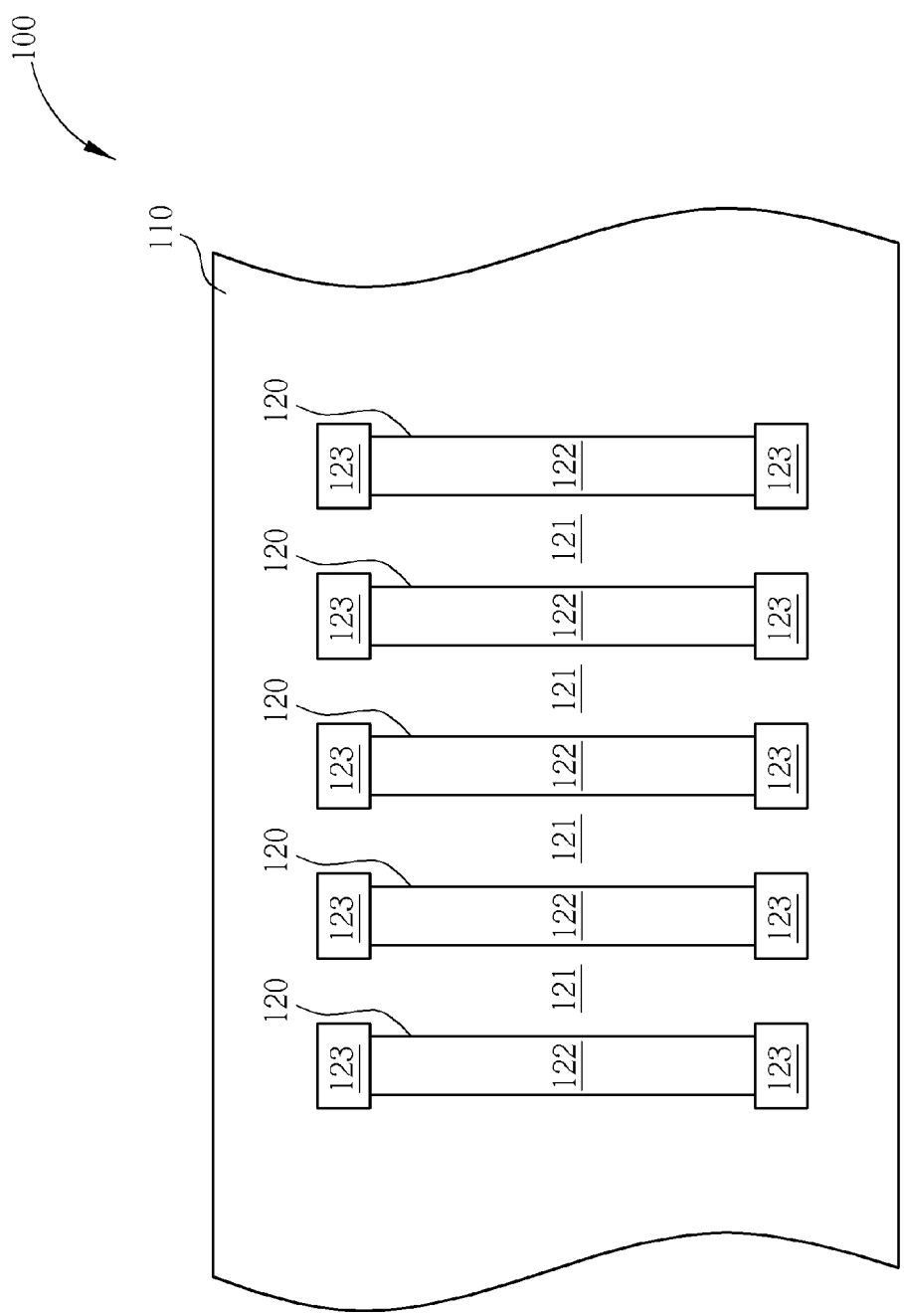
FIG. 3 illustrates the design of the phase shift mask according to the present invention.

FIG. 3 Illustrates a preferred embodiment of the design of the phase shift mask according to the present invention. The phase shift mask 100 includes a glass substrate 110 and a predetermined first pattern 120, such as multiple parallel dense line patterns, on the surface of the glass substrate 110. The glass substrate 110 itself has a first phase. In order to form the first pattern 120, taking the line patterns of the present invention for example, a second phase exists between each pair of line patterns, such as the first phase shift region 121 and the second phase shift region 122 shown in FIG. 3. The first pattern 120 is a pattern formed by the phase difference of the two phase shift regions. This is conventional and the details will not be discussed. The phase shift mask 100 is preferably a Cr-less phase shift mask. The phase difference of the first phase shift region 121 and the second phase shift region 122 may be formed by conventional methods, such as adjustment of the thickness of the substrate or usage of phase shift material.

In order to avoid the interconnect encountered in the prior art when the critical dimension of the pitch of the pattern is too small, a third phase shift region 123 is disposed at the border of the two phase shift regions to cancel the interference of light between the two phase shift regions. The method for forming the third phase shift region 123 is similar to the methods for forming the first phase shift region 121 and the second phase shift region 122, such as adjustment of the thickness of the substrate or usage of phase shift material.

The phase shift correspondence among the first phase shift region 121, the second phase shift region 122 and the third phase shift region 123 is relative and arbitrary. For example, the phase shift of the first phase shift region 121, the second phase shift region 122 and the third phase shift region 123 may be respectively 180°, 0°, 90°, so that a predetermined electromagnetic wave has a phase difference of 180° after passing through the first phase shift region 121 and the second phase shift region 122. To solve the problem that a conventional phase shift mask causes independent line patterns to interconnect to form annular defects, the third phase shift region 123 is designed to render a predetermined electromagnetic wave to have a phase difference of 90° after passing through the first phase shift region 121 (or the second phase shift region 122) and the third phase shift region 123.

The width of the second phase shift region 122 depends on the desired width of the patterns. For example, if the width of the line patterns is 37.5 nm, the width of the second phase shift region 122 may be 75 nm. In other words, it may be twice as wide as the required width of the line pattern.

If the annular defects connected by two independent line patterns need eliminating, the width of the third phase shift region 123 should be not less than that of the second phase shift region 122, and preferably wider. For example, one side of the third phase shift region 123 is about 1%-5% wider than that of the second phase shift region 122, so that the third phase shift region 123 is about 2%-10% wider than the second phase shift region 122.

Figure 4:
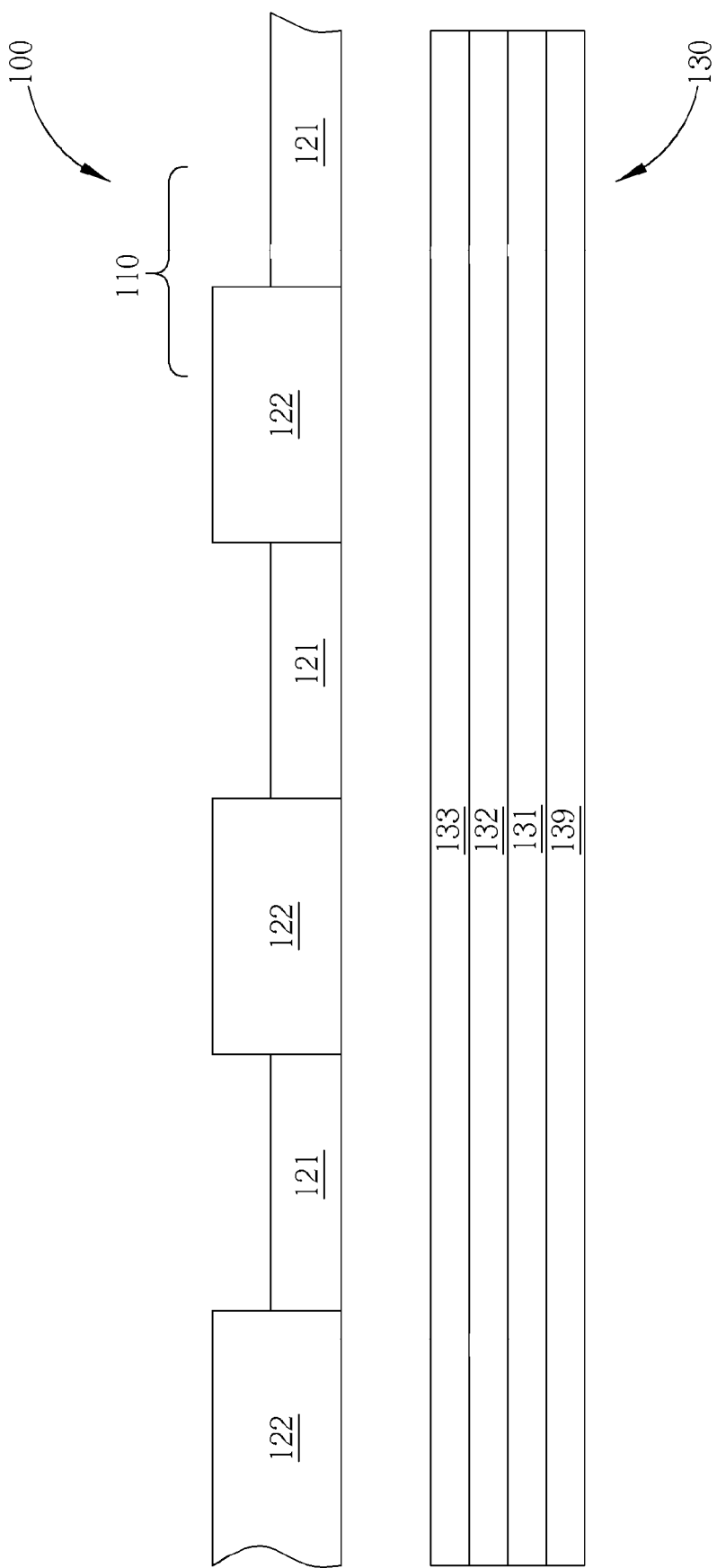
FIG. 4 illustrates transferring a pattern on a substrate of the method for forming a pattern according to the present invention.

As shown in FIG. 4, a first exposure procedure is performed to transfer the first pattern 120 on the phase shift mask 100 to a substrate 130. The substrate 130 is usually a composite structural layer so that the first pattern 120 on the phase shift mask 100 can be correctly transferred. For example, the substrate 130 may include a silicon substrate 139, with a first thin film 131 and a second thin film 132 formed thereon and a first photosensitive material 133, such as a photoresist, to cover the second thin film 132. Optionally, the substrate 130 may additionally include other material layers, such as a BARC.

Figure 5:
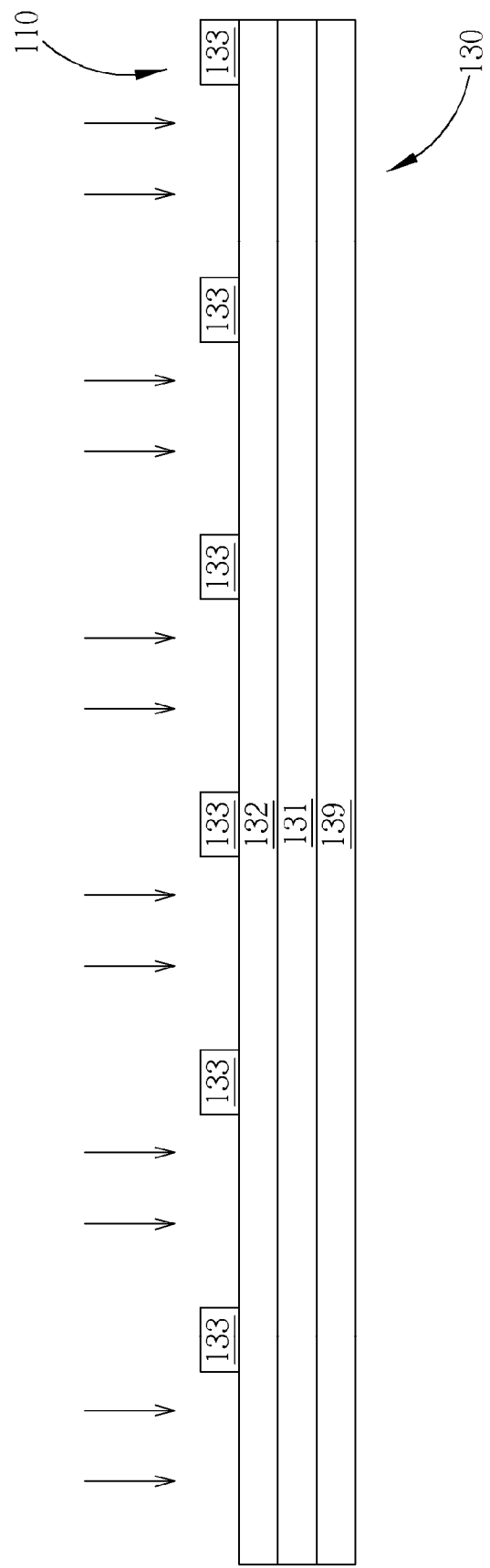
FIG. 5 illustrates an etching step of the method for forming a pattern according to the present invention.
Figure 6:
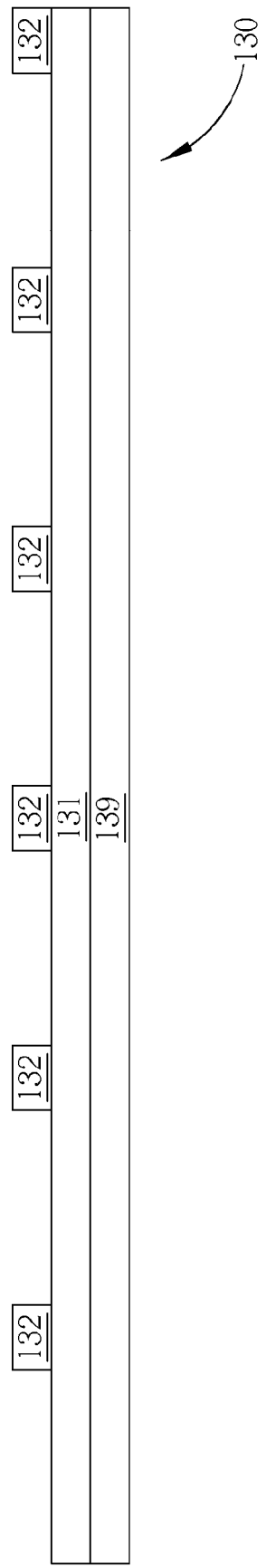
FIG. 6 illustrates a patterned film of the method for forming a pattern according to the present invention.

As shown in FIG. 5, after the exposure and development of the first photosensitive material 133, the first pattern 120 is correctly transferred onto the first photosensitive material 133 of the substrate 130 so that patterns are formed on the photosensitive material 133. Later, the patterned photosensitive material 133 is used as an etching mask to perform an etching procedure on the second thin film 132, formed of silicon nitride for example, to pattern the second thin film 132. After the photoresist is stripped, the patterned second thin film 132 is shown in FIG. 6.

Figure 7:
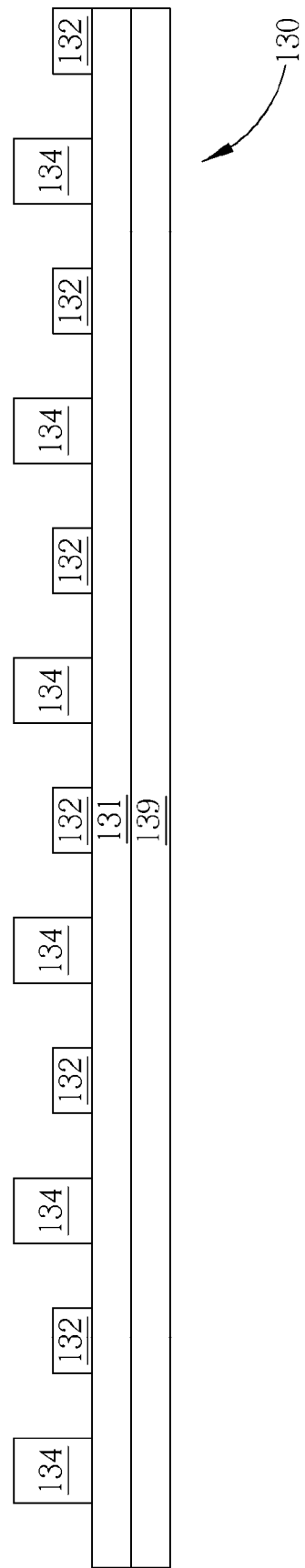
FIG. 7 illustrates the alternate arrangement of the photosensitive material and the film of the method for forming a pattern according to the present invention.
Figure 8:
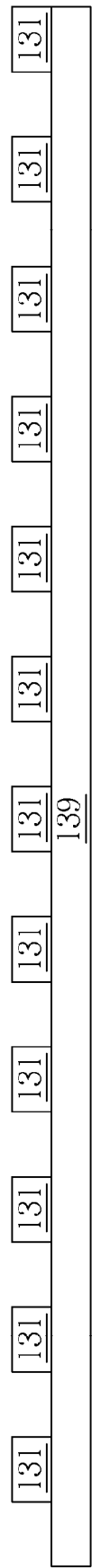
FIG. 8 illustrates the line patterns formed on the substrate after two sets of exposure and etching of the method for forming a pattern according to the present invention.

Then, a stepper and scanner are used to horizontally move the phase shift mask 100 to carry out a second exposure to transfer the pre-determined pattern onto a newly added second photosensitive material 134 of the substrate 130, so that the second photosensitive material 134 and the second thin film 132 are alternately arranged on the first thin film 131 after a suitable development, as shown in FIG. 7. Repeating the previous etching procedure, the second photosensitive material 134 and the second thin film are used together as the etching mask 132 after the second exposure to transfer the pattern onto the underneath first thin film 131, as shown in FIG. 8. After two exposure procedures and two etching procedures, the alternately arranged line patterns now are formed on the substrate 130.

Figure 9:
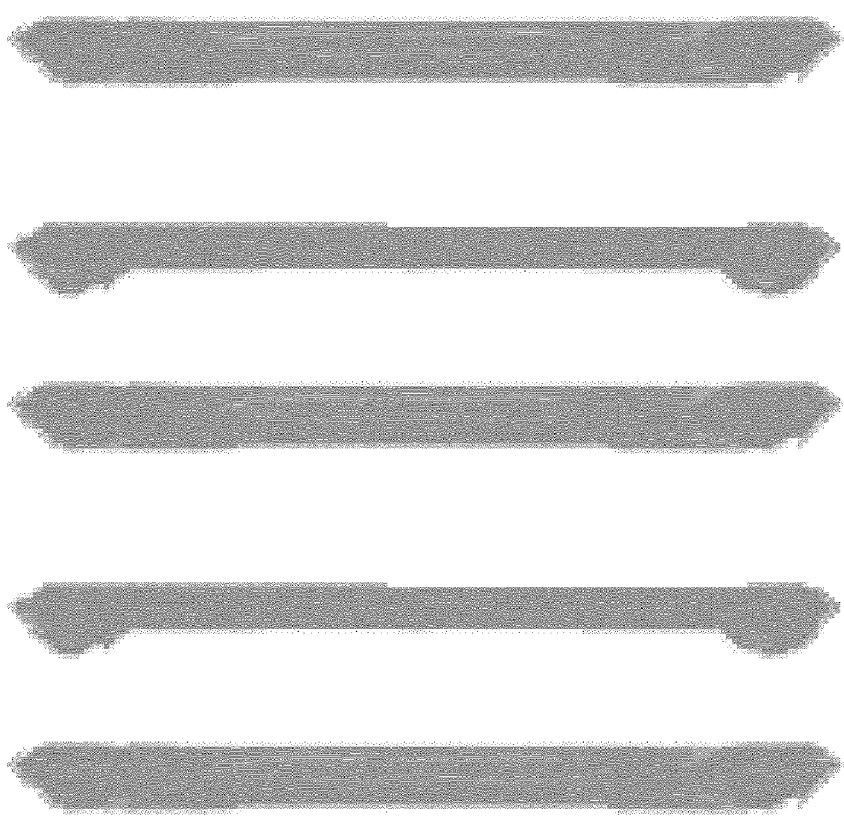
FIG. 9 illustrates the line patterns of the method for forming a pattern according to the present invention.

If the width of both the first phase shift region 121 and the second phase shift region 122 on the phase shift mask 100 is 75 nm, line patterns around 37.5 nm width are formed on the first thin film 131 on the substrate 130 after two exposures, as shown in FIG. 9.

Because the first phase region additionally includes a third phase-shift region, which is capable of canceling the adverse effect of the interference on the border near the phase inversion, even if the pitch of the patterns on the phase-shift mask shortens, the phase conflict on the border of the phase inversion and the undesired interconnect can be prevented. The resolution and the quality of the lithographic patterns formed by the masks are ensured and the problems in the prior art are solved. Therefore, the pre-determined line patterns of narrow width are formed on the substrate after two exposures and etchings.

Those skilled in the art will readily observe that numerous modifications and alterations of the device and method may be made while retaining the teachings of the invention.

What is claimed is:

1. In a phase-shift mask having a substrate with a pattern formed on the substrate, wherein the pattern is constituted of multiple first phase-shift regions and multiple second phase-shift regions adjacent to said first phase-shift regions, wherein the improvement comprises:

multiple third phase-shift regions exclusively formed on each terminal end of multiple second phase-shift regions, wherein a phase difference exists between said third phase-shift regions and said first phase-shift regions.

2. The phase-shift mask of claim 1, wherein said at least one terminal end is connected to said first phase-shift region.

3. The phase-shift mask of claim 1, wherein said phase difference is 90°.

4. The phase-shift mask of claim 2, wherein said phase difference is 90°.

5. The phase-shift mask of claim 4, wherein said pattern is linear.

6. A method for forming a pattern by using the mask as claimed in claim 1, comprising the steps of:
   performing a first exposure to transfer a first pattern on said first phase-shift mask to a substrate; and
   performing a second exposure to repeatedly transfer said first pattern to said substrate to form said pattern.

7. The method of claim 6, wherein the width of said third phase-shift region is larger than that of said first phase-shift region.

8. The method of claim 6, wherein said second exposure is to horizontally move said mask to repeatedly transfer said first pattern to said substrate so as to form said pattern.

* * * * *